United States Patent [19] [11] 3,989,946
Chapman et al. [45] Nov. 2, 1976

[54] ARRAYS FOR INFRARED IMAGE DETECTION
[75] Inventors: Richard A. Chapman, Dallas; Kenneth E. Bean, Richardson, both of Tex.
[73] Assignee: Texas Instruments Incorporated, Dallas, Tex.
[22] Filed: Mar. 31, 1975
[21] Appl. No.: 563,541

[52] U.S. Cl. ............................. 250/332; 250/338; 250/370; 357/30
[51] Int. Cl.² .................................. H01J 31/49
[58] Field of Search ............... 250/211 J, 370, 332, 250/334, 338; 357/49, 2, 30; 307/311

[56] References Cited
UNITED STATES PATENTS

| | | |
|---|---|---|
| 2,812,446 | 11/1957 | Pearson ............................ 250/211 J |
| 3,005,937 | 10/1961 | Wallmark ............................ 357/49 |
| 3,617,823 | 11/1971 | Hofstein ............................ 250/211 J |
| 3,691,389 | 9/1972 | Ellis et al. ............................ 250/211 J |
| 3,930,161 | 12/1975 | Ameurlaine et al. ................. 357/30 |

*Primary Examiner*—Harold A. Dixon
*Attorney, Agent, or Firm*—Harold Levine; James T. Comfort; William E. Hiller

[57] ABSTRACT

This disclosure defines an infrared image detector formed in a block of semiconductor material by etching slots in the semiconductor material. The slots define the individual detectors, effectively isolate them from each other both optically and electrically, and permit the detectors to be placed very close to each other.

17 Claims, 15 Drawing Figures

Fig. 10 TOP SLOTS   BOTTOM SLOTS

TOP SLOTS

BOTTOM SLOTS

Fig. 15

VIDEO OUTPUT
MULTIPLEXER
INTERFACE CIRCUIT
VERTICAL SWITCHES

ARRAYS FOR INFRARED IMAGE DETECTION

This invention relates to infrared image detectors and more particularly to an array of detectors formed from a single block of semiconductor material.

THE PRIOR ART

Near-infrared and visible image detectors have been made in the past using arrays of silicon photodiodes or charge coupled devices (CCD). These detectors use "intrinsic" band-to-band photoabsorption transitions. Readout from these arrays has been by utilizing one set of leads (for example, in the X-Dimension) and a Y-set of linear arrays.

Non visible longer wavelength infrared detectors have been fabricated using doped semiconductors with extrinsic photoresponse due to photoionization of the impurity dopant. Detectors for the 3–5 micrometer, 8–14 micrometer, and longer wavelengths have been built. The wavelength band for infrared detection depends on the impurity added (thus, "extrinsic" response). The detector is usually a photoconductive detector with the semiconductor being doped to be either wholly N-type or wholly P-type. Efficient infrared sensitivity is obtained by cryogenically cooling the semiconductor to a low temperature (typically 65°–77° K temperature for 3–5 micrometer response and 20°–30° K temperature for 8–14 micrometer response); the conductivity of the doped semiconductor is considerably reduced by cooling so that the infrared induced conductivity can be detected.

In the past, arrays of silicon and germanium infrared photoconductive detectors have been made by fabricating individual detectors and assembling these together to make an array. Alternatively, monolithic arrays of silicon detectors have been fabricated in one slice of silicon, but this technology is limited to the use of relatively large detectors with large separations to minimize optical and electrical cross talk. In the case of mercury-doped germanium photoconductive detectors, the germanium must be the order of one centimeter thick in the direction of the incident radiation. Linear arrays of mercury-doped germanium detectors have been fabricated by the use of orientation dependent etching. In this case, the infrared radiation is incident on the edge of a mercury-doped germanium wafer through which slots have been etched parallel to the direction of the incident radiation and separating the wafer into long narrow detectors which may be typically 1 × 1 × 1 cm. The slots are etched into the top surface of the germanium wafer and the electrical contacts are placed on the top and bottom of the germanium wafer. This mercury-doped germanium array structure is not monolithic after etching, only linear arrays can be fabricated, and the structure is not adaptable to combining the detectors and the electronic processing circuitry (such as preamps and multiplexers) on the same wafer.

SUMMARY OF THE INVENTION

One embodiment of the invention is a matrix array for infrared image detection wherein two sets of slots are etched in a doped silicon substrate by orientation dependent etching. The first set of slots is etched from the top surface of the substrate to form a plurality of parallel slots, and the second set of slots is etched from the bottom surface of the substrate to form a plurality of parallel slots extending in a direction which intersects the direction of the first set. The top and bottom slots intersect with each other inside the slice. Either silicon or germanium may be used for the slice. When these materials are used, a (110) crystal orientation is used and the vertical walls of the slots etched thereby by orientation dependent etching are (111) surfaces.

The top surface of the slice has an electrically conductive metal coating of varying thickness deposited in part on an insulator placed on the semiconductor such that substantially thick opaque metallic regions are disposed in spaced-apart relationship along the top surface passing along the top of the silicon bars defined by the slots etched in the top surface. A relatively thin transparent metallic layer may be disposed elsewhere on the top surface of the semiconductor substrate. These metallization layers form the electrical contacts to the tops of the detectors, serve as optical field stops, and electrical leads to the electronic processing circuitry.

The bottom surface of the silicon has metallic layers serving as leads and also as the bottom electrical connections for the detectors. This metallic layer passes along the bottom surface of the silicon bars defined by the slots etched in the bottom surface.

A nonconductive opaque material may be deposited in the top slots to block incident radiation from injecting radiation signal and noise into the detector through the slots. Alternatively, the slots may be made extremely narrow to minimize sensitivity to radiation incident on the slots and then no opaque coating will be required.

It is intended to operate the array at a low temperature (e.g. below about 30° K for gallium-doped silicon or below about 77° K for indium-doped silicon) so that the resistance of the detector is set by the photo generated majority carriers in the semiconductor substrate due to radiation background incident on the top of the substrate.

Low noise ohmic contacts may be provided by diffusing a P+ layer into the P-type semiconductor substrate, wherein the P+ layers are formed on the top and bottom of the substrate prior to etching of the slots. A diffusion mask may be used on the top surface of the semiconductor to limit the top P+ regions to the tops of the infrared detectors. When an N-type semiconductor is used, N+ layers are formed in a similar manner.

This method of fabrication of arrays of infrared detectors permits the placement of the electronic processing circuitry on the same semiconductor wafer with the infrared detectors. For instance if the matrix array is fabricated in the center region of a semiconductor wafer, electronic processing circuitry such as preamplifiers and multiplexing circuits may be fabricated on the top (and bottom) surface of the semiconductor surrounding the matrix array. The electronic processing circuitry and the infrared detectors may be electrically connected by metal leads deposited on the oxidized (or otherwise electrically isolated) semiconductor surface.

One feature of the present invention is to define a method of producing an array so that it may be mechanically or electrically scanned to provide an image readout, for example, a horizontally multiplexed array with a mechanical or electronic scan for the vertical direction to give a TV-compatible output or alternatively a vertical multiplex and horizontal delay-and-add system with the infrared picture swept along the horizontal direction by a mechanical scan.

Another feature of the invention is to produce an "almost-contiguous" detector array to optically and electrically isolate the detectors from each other within the array through the use of extremely narrow slots relative to the size of the detectors. A linear array, a matrix array, or other configurations combining detectors can be fabricated in an almost-contiguous structure.

An additional feature of the invention is a matrix array of infrared detectors formed in a single block of extrinsic semiconductor material by etching very small slots between the detectors.

Still another feature of the invention is a matrix array of detectors in which the detectors across the array are variably spaced so that the center of the array consists of small area detectors while the periphery consists of large area detectors.

DESCRIPTION OF THE DRAWINGS

The present invention includes a linear array of detectors (detectors with infrared active areas placed in one line) or a matrix array which may be a combination of linear arrays. The invention is best explained by first understanding the linear array embodiments and then explaining the matrix array embodiments.

For a more complete understanding of the present invention and for further features and technical advances provided thereby, reference may now be made to the following description taken in conjunction with the accompanying drawings, in which.

Figure 1:
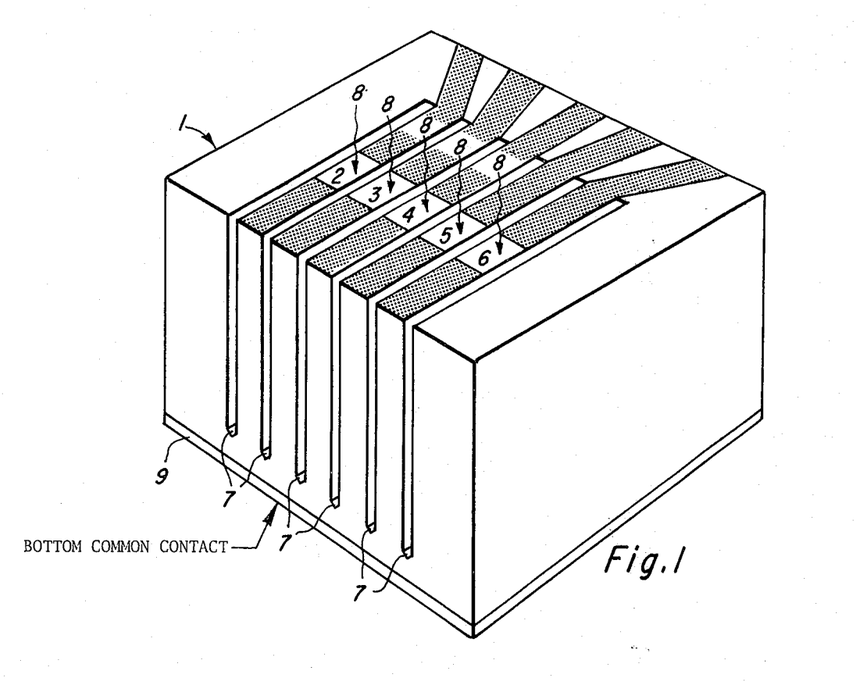
FIG. 1 is a three-dimensional cross-section of a five detector linear array.

Referring now to the drawings, FIG. 1 illustrates a three-dimensional cross-sectional view of a five element array 1. The detectors are noted by the numbers 2 through 6, and are separated from each other by narrow slots 7. These slots isolate the detectors from each other both optically and electrically and may be, for example, about 0.2 mil wide and about 10 mils deep. The slots do not have to extend through the entire block of material (for example, silicon), but may be of limited length as shown in the top view of the structure illustrated in FIG. 2. The length of the slots may be, for example, 14 mils. The semiconductor bars in which the detectors are located are supported by bulk silicon at each end of the slots. For this reason, the slots may be etched completely through to the rear of the semiconductor slice.

Figure 2:
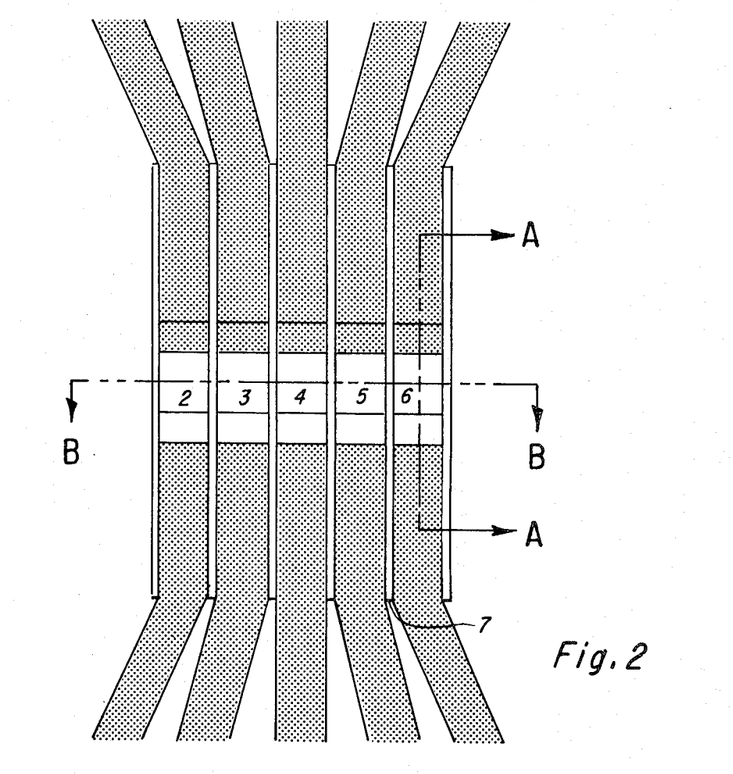
FIG. 2 is a top view of the five element array of FIG. 1.

The top surface of each detector is indicated in FIGS. 1 and 2 and designated by the numbers 2 through 6. The direction of incident radiation is indicated by the arrows 8 in FIG. 1. Each detector may be biased from top to bottom in the direction of the radiation. The top contacts may serve also as field stops to delineate the active width of the detectors along the silicon bars formed by the slots. The bottom contact 9 is common to all of the detectors.

Figure 3:
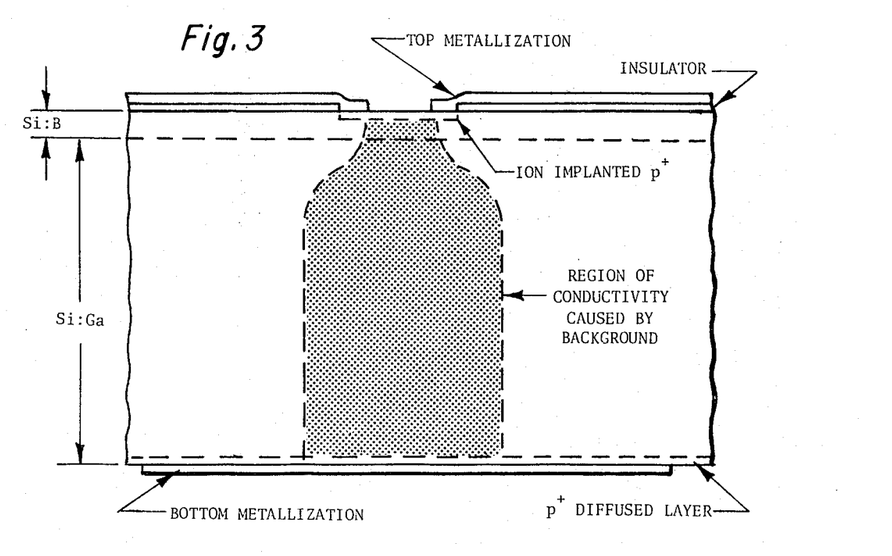
FIG. 3 is a cross-section AA of one detector of the array in FIG. 2.

Looking more specifically at FIG. 2, a top view of the linear array of detectors is illustrated. The top dimensions of the detectors may be, for example, 1.8 mils (between slots) and 2.0 mils in the other direction. The detectors shown have active areas (e.g., 1.8 mils by 2.0 mils) which are rectangular in cross-section with corners formed by sides intersecting at 90°. Other linear configurations can be built. For instance, the linear direction of the linear array may not be perpendicular to the walls of the slots; if the angle between the linear direction of the array and the slots is 70.53°, the detectors will be parallelograms with two corners with 70.53° angles and the other two corners 109.47°. The cross-hatched areas in FIG. 2 are metal expanded contacts. The contact metal is placed on an insulating layer on the top of the bars formed by the slots and extends onto the silicon on either side of the detector. The metal contact material is opaque to radiation, thereby limiting the active detector area to that portion which is not cross-hatched. FIG. 3 shows a cross-section along a silicon bar as indicated by the section line AA in FIG. 2. The electrical contact to the top of the detectors is formed on 1 mil on either side of the top of the detector where the insulating layer is removed and the metal touches the semiconductor. A P+ diffused layer is shown adjacent to the bottom contacts to assure noise-free contacts. An ion implanted P+ or P+ diffused layer may be formed in the top surface of each detector and underneath the contacts to improve the contacts and to provide conductivity to the center of the top surface of the detector; this function may be provided in part by the epitaxial layer shown when it is necessary to include this layer for the operation of CCD's, etc. Also illustrated is the manner in which the top metallization contacts also serve to isolate the detectors by blocking radiation. An approximate indication is given of the region of conductivity caused by background radiation. Background radiation and signal spread-out will not contribute to cross-talk between detectors since the slots are made long enough to prevent internal reflection radiation from reaching the ends of the slots where the silicon bars are joined together.

Figure 4:
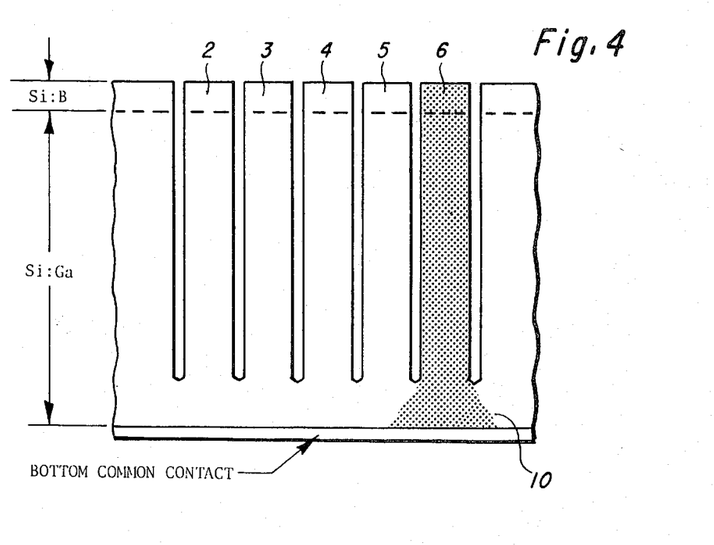
FIG. 4 is a cross-section BB along the linear array of FIG. 2.

FIG. 4 shows a cross-section cut across the slots in the silicon bar as indicated by the section line BB in FIG. 2. The background and signal radiation will be confined by internal reflection at the slot surfaces. The area to which the radiation is convined inside detector 6 is shown by the cross-hatch lines 10. The radiation spread-out in the region beneath the slots can be eliminated by etching the slots completely through the silicon. If slots are not etched completely through, there is not much optical cross-talk because the region near the common ground (bottom) contact causes a smaller electrical cross-talk effect than if the optical cross-talk were near the signal (top) contacts.

The use of an epitaxial layer of boron-doped silicon (Si:B) on the top of the gallium-doped silicon detectors, in addition to improving contact to the detector, may be necessary in those other portions of the silicon wafer in which CCD's and MOSFET circuits will be formed. The reason for the placement of these devices in this layer will be discussed at a later point. The fact that each gallium-doped detector has a thin boron-doped epitaxial layer in series with it will not degrade detector performance. An N-type diffusion (not shown) may be placed on each side of the detector array to completely eliminate potential electrical cross-talk between the detectors caused by the higher conductivity of the boron-doped layer.

The above description of the linear array shown in FIGS. 1–4 has been given for detectors formed in gallium-doped silicon for use in the 8–14 mm wavelength region with operation near 30° K temperature or below. Aluminum doping could be substituted for gallium doping. If 3–5 mm wavelength response with operation at a higher temperature (65°–77° K) is desired, the silicon wafer can be doped with indium with the epitaxial layer (if used) still being boron-doped silicon. The invention is not limited to a specific choice of impurity. Acceptor impurities with various different wavelength regions of sensitivity and operating temperatures which could be used include but are not limited to boron, aluminum, gallium, indium, zinc, mercury, copper, magnesium, beryllium, or other commonly used acceptor impurities. Donor impurities which could be used include but are not limited to phosphorus, arsenic, antimony, bismuth, sulfur, tellurium, or other commonly used donor impurities. If germanium is used instead of silicon, these same impurities can be selected for use.

Although the slot technique is ideally suited for "almost contiguous" linear arrays, it could be adapted for other uses. The term "almost contiguous" is used since the slots can be made extremely narrow so that the surface of the semiconductor is covered with detectors with very little inactive area (the slots); the array is not fully contiguous because of the narrow slots. The detectors need not be in a linear array along the etched-out bars of silicon. They may be alternately displaced to give two parallel arrays of detectors with the top contacts coming out in alternate directions. In another design, every other detector could be eliminated to prevent optical cross-talk for one array of detectors.

In the foregoing arrays, the narrow slots separating detectors may be formed by orientation dependent etching. This etching process is well known and is generally discussed in the article "Semiconductor Silicon/1973," Electrochemical Society, 1973, p. 880, by K. E. Bean et al. The etching process has been further investigated and discussed in an article published by D. L. Kendall, Applied Physics Letters, 26, pages 195–198 (Feb. 15, 1975). In general, these articles discuss the differences in etch rate of certain crystallographic planes of silicon in the KOH—$H_2O$ and KOH-alcohol etches. In particular, planes with high packing densities such as {111}, {221}, {331}, and {112} etch as much as 100 and 500 times slower than the more loosely packed {100} and {110} planes respectively.

The {100} silicon slice orientation provides fourfold symmetry. Therefore, the four slow-etch and slow-growth {111} planes intersect the 100 slice surface at 90° to each other, and at a rather steep angle of 54.74° to the surface. This allows the desired square or rectangular pattern for device or circuit isolation layout. Several other advantages may be gained in process control by use of the 100 silicon slice (surface) orientation. The etch depth, or isolation depth, may be quite accurately controlled by using orientation-dependent etch (ODE). Due to the trace of the slow etching {111} planes intersecting the 100 surface plane at an angle of 54.74°, the etch depth becomes a direct factor, 0.707 × the etch mask opening width. That is, a mask opening 1 mil wide, properly aligned with the [110] direction, will etch 0.707 mil deep into the 100 surface, and then for practical purposes stop.

If one examines the stereographic projection of the {110} silicon crystal, a mirror-image symmetry of {111} planes intersecting the (110) surface at 90° will be seen. This offers a very steep (vertical) 90°, slow etching (111) plane boundary which will give the ultimate packing density (very narrow isolation width). The etching of a properly aligned mask of straight lines in one direction, parallel to either pair of these {111} planes, provides very exact vertical etched moats. Practically no undercutting of the mask in the [111] direction occurs even at deep, 3- to 4-mil etch depths.

Figure 5:
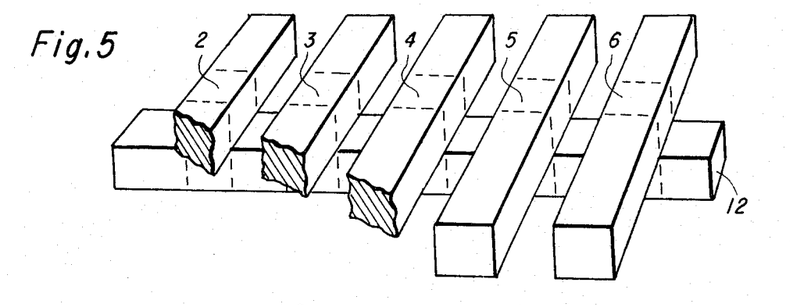
FIG. 5 illustrates five detectors formed by cross bars of silicon.
Figure 6:
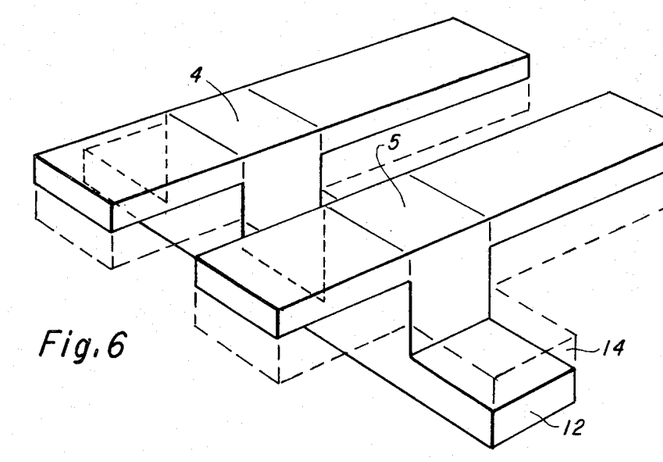
FIG. 6 illustrates two detectors of those shown in FIG. 5 with improved isolation obtained by additional etching.
Figure 11:
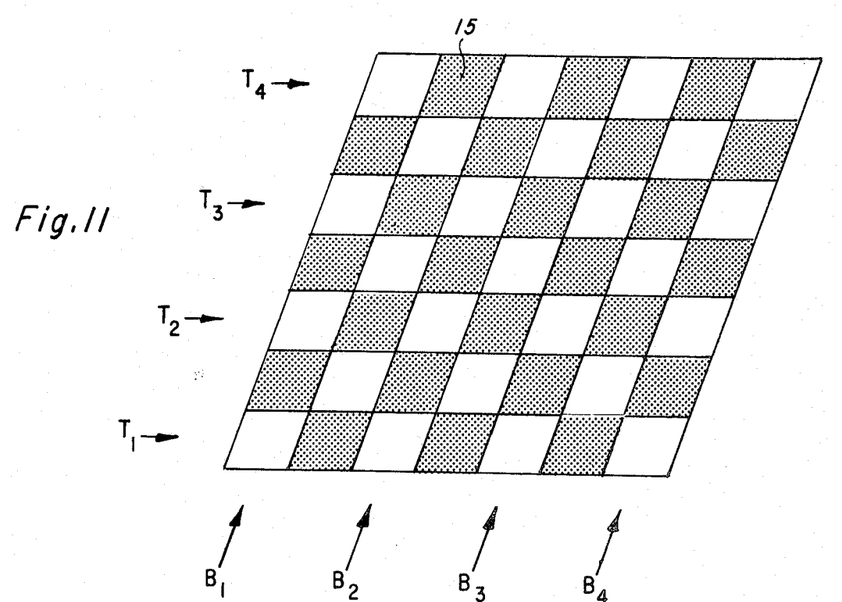
FIG. 11 is a top view of the matrix array of FIG. 7 illustrating the shape of the array resulting from etching.

The previously described linear arrays only illustrate etching vertically from the top of the (110)-oriented semiconductor wafer, for example, to separate the detectors. This array may be improved by etching from the underside also to form the detectors shown in FIG. 5. The actual volume of the detectors is shown by the dotted lines. The bulk material that holds the bars in place at the ends of the bars is not shown for sake of clarity. Both top and bottom slots are etched at least halfway through the silicon wafer. The bottom slot pattern must intersect the top slot pattern at an angle of 70.53° because the walls of both the top and bottom slots must be (111)-faces of the crsytal and these planes intersect at 70.53° in the (110) plane. The linear array matrix illustrated in FIG. 5 is formed by etching two slots from the bottom side of the wafer leaving bar 12. Improved isolation can be obtained by etching the slots more deeply into the silicon wafer. FIG. 6 illustrates two detectors of the array of FIG. 5 in which extra silicon 14 has been removed. The extra silicon 14 removed is shown by the dotted lines. If the number of bottom slots is increased, a matrix structure may be obtained. In this design each bottom silicon bar has a solid contact as is shown generally in FIG. 7. The matrix has been generally designated with top rows T1 through T4 and bottom rows B1 through B4. An outline of one detector is shown in dashed lines in FIG. 7. In this design each bottom silicon bar B has a solid contact 17. The top bars T have a solid contact alternating with an infrared transmitting P+ ion implanted layer over each detector. The matrix structure of FIG. 7 has top and bottom bars intersecting with acute angles of 70.53° as is also the case with FIGS. 5 and 6. This is illustrated in FIG. 11.

Figure 7:
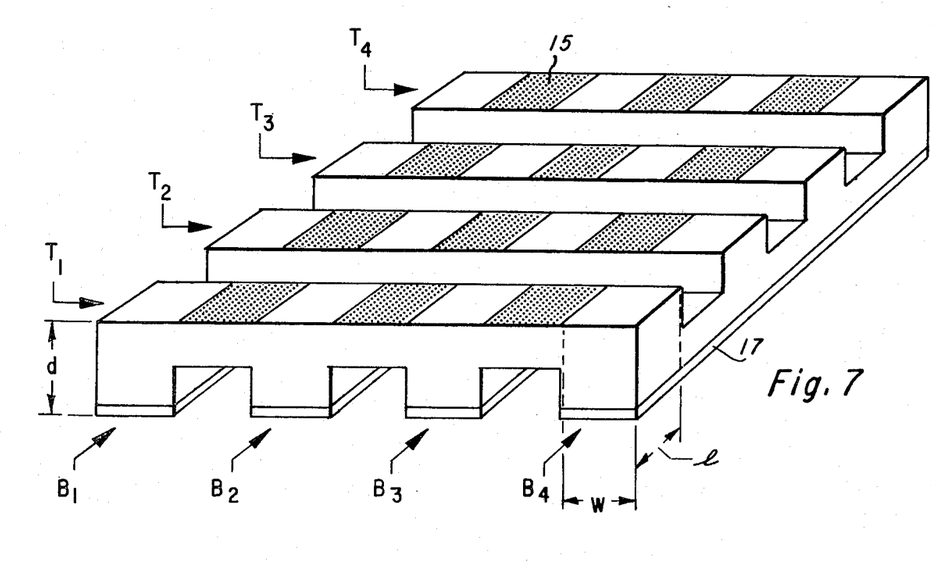
FIG. 7 is a matrix array of detectors formed according to one aspect of the invention.
Figure 8:
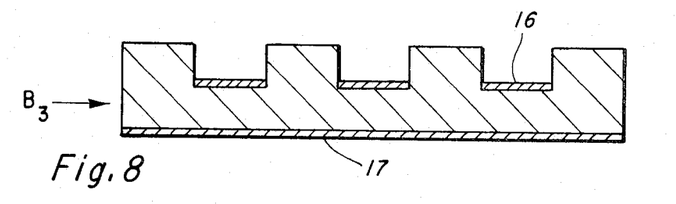
FIG. 8 is a cross-section along B of the matrix array of FIG. 7.
Figures 9, 10:
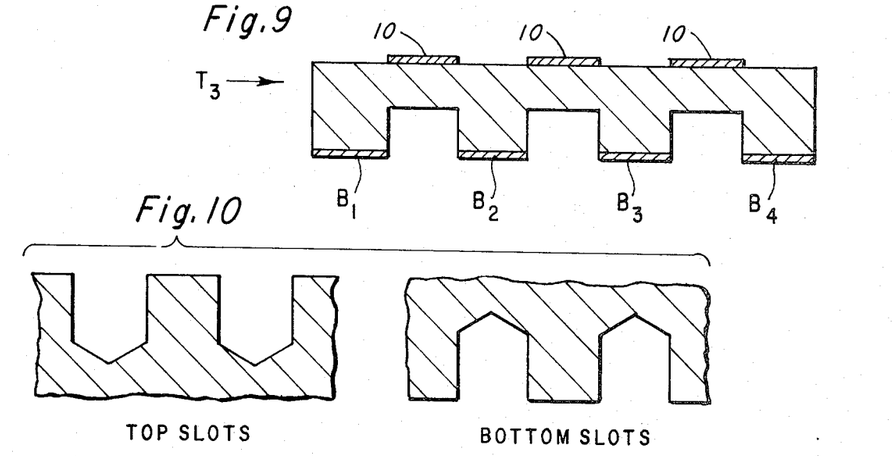
FIG. 9 is a cross-section along T of the matrix array of FIG. 7.
FIG. 10 illustrates slots formed by etching when making the detector.

The array of FIG. 7 is shown in cross-section in FIGS. 8 and 9. FIG. 8 is a cross-section taken along one of the bars B whereas the bottom contact is shown continuous across the bar. Opaque nonconducting material 16 (such as an epoxy) may be placed in between the detectors in the slots, or alternatively the slots may be completely filled with material to prevent incident radiation from injecting signal and noise into the detector. The narrower the slots, the less need there is for placing this material in the slots. For instance, the detectors could be 1.8 mils on a side separated by 0.2 mil slots forming a matrix array of detectors.

The cross-section along a top bar T is shown in FIG. 9. The opaque material is shown on the top and the contact material is shown at the locations B on the bottom. Although FIGS. 5, 6, 7, 8 and 9 have been drawn for the case of equal width slots and silicon bars, it should be recognized that slots of any width could be used. For instance the top and bottom slots may be 0.2 mils wide and the silicon bars may be 1.8 mils forming a nearly-contiguous matrix array of detectors.

As previously mentioned, orientation dependent etch may be used in the process of making these detectors. While the bottom of each slot has been shown flat in the various illustrations, in practice the slot bottoms may not be flat, but be as illustrated in FIG. 10. The bottoms of the slots can actually be the intersection of two (111) planes and are at 35° angle to the (110) surface. Other additional slanted walls will occur at the extreme ends of the narrow slots.

These arrays are intended to operate at a low enough temperature so that the resistance of the detector is set by the photogenerated majority carriers due to the radiation background incident on the top of the slice. The purpose of the opaque coating areas on the top surface and the opaque deposits in the top slots is to eliminate or greatly reduce the light incidence on all except the top surface of the detector. In the event that the semiconductor has been too heavily doped (causing impurity band conduction), or its temperature is too high, or the opaque parts have not been used, then some current will flow through the connecting bars between the detectors. That is, the current will not flow from the bottom contact up to the detector, but current will flow from the connecting bars between the detectors up into the detectors themselves. This effect is minimized but not eliminated by the use of insulating layers to limit the region in which the metal contacts the semiconductor as shown in FIG. 3 for a linear array. Although not shown in FIGS. 7 and 8, a similar alternation of metal-touching-semiconductor and metal-on-insulator could be used.

Low noise ohmic contacts may be made by diffusing a P-type layer into the P-type semiconductor material. The P+ regions will be placed on top and bottom of the slice before slots are etched. Alternatively, the P+ regions can be formed by ion-implantation before or after the slots are etched. The P+ layer will be only a few microns thick. Boron may be used, for example, as the dopant for the P+ layer. If N-type semiconductors are used, an N+ layer will be diffused.

After etching the slots, aluminum or indium may, for example, be deposited on the P+ regions. These layers then may be sintered to form the metal contacts. In some instances, it may be desirable to have a thin layer of metal over a detector. The thin metal layer will have to be less than 200–400 angstroms thick to pass a sufficient portion of the incident light. The P+ layer under the thin metal layer will also have to be thin to prevent photoabsorption of too much of the radiation before it enters the active region of the semiconductor detector.

Figure 12:
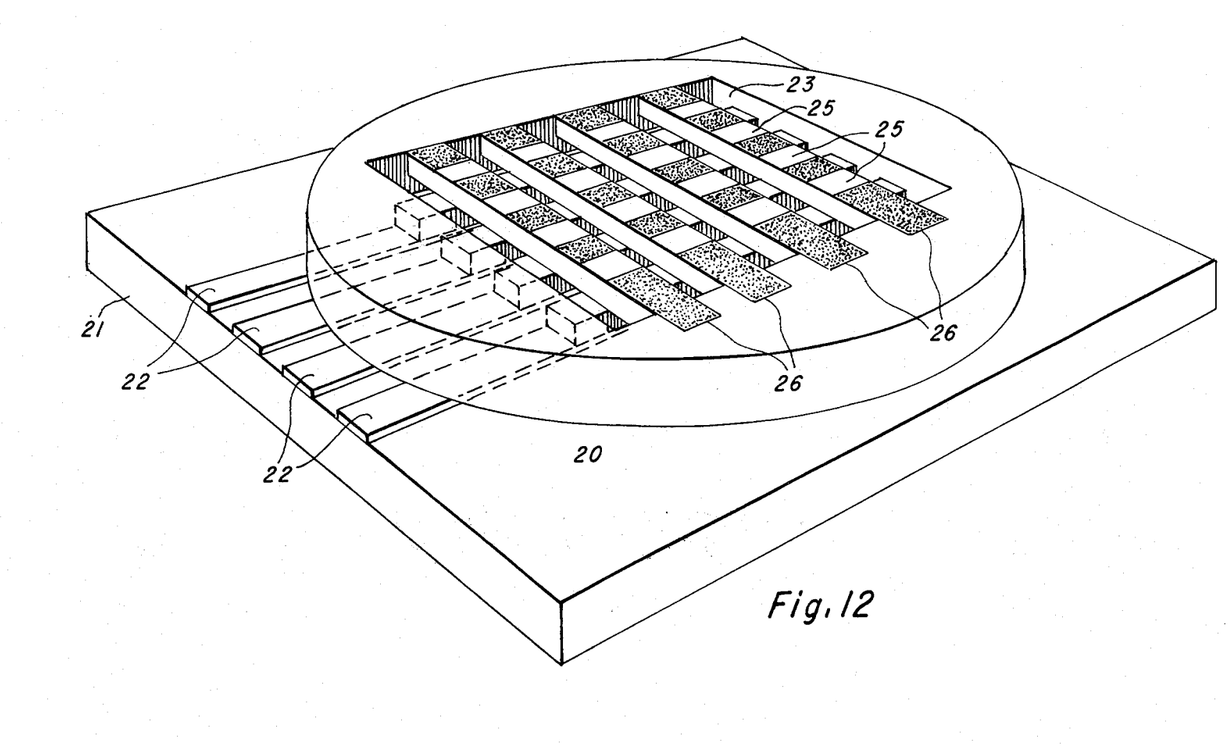
FIG. 12 illustrates the matrix array of FIG. 7 formed in a semiconductor wafer and mounted on a base.

The bottom contact is made of a thick soft metal so that the metal layer will tend to relieve stress generated by thermal differential stresses between the semiconductor and its mount. In order to cool the detector wafer to the desired operating temperature, this mount must also serve as the thermal connection to a cryogenically cooled dewar. The wafer may be placed on the electrically insulating mount with deposited metallized strips and bonded and electrically connected thereto to match the B strips on the semiconductor wafer. The mount must have a good thermal conductance. An illustration of mounting a wafer on the mounting surface is shown in FIG. 12. A 4 × 4 array formed within a semiconductor wafer is mounted upon the mounting base. The hatched regions 26 are the thick coatings of metal and the regions designated 25 are the actual detector. Similar mounts will be used for linear arrays.

Some matrix embodiments of this invention will require electronic circuitry on both the top and bottom surfaces of the silicon wafer containing the detectors and with the bottom and top contacts of the detectors connected by metal strips separated from the semiconductor by an insulator layer such as silicon oxide except at the ends of the strips which touch the detectors and the electronic processing devices. Electrical connections to the wafer will be made at the output of the electronic processing circuitry on the top and bottom surfaces of the semiconductor wafer. In this case, the electrically insulating thermally conducting mount will have metallization pads matching the metallization pads to the output circuitry on the bottom of the silicon wafer.

Figure 13:
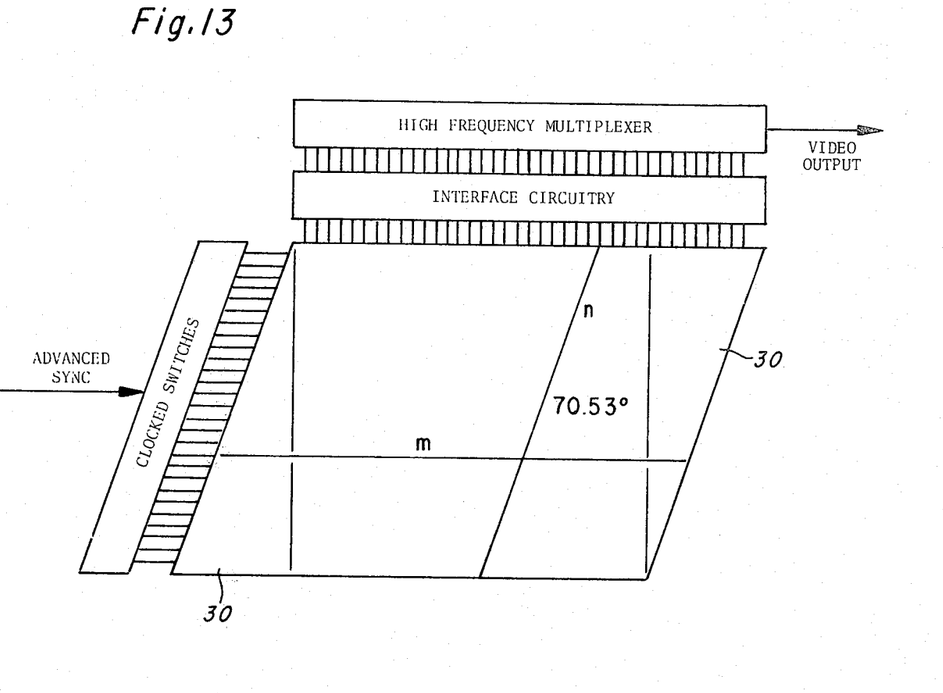
FIG. 13 illustrates a matrix array used in conjunction with electronic circuits to scan the array and provide a signal output.

This circuitry may be interface circuitry (such as preamplifiers, biasing circuitry, and DC or AC coupling circuitry) between the detector and a multiplexer. Such an arrangement may be as illustrated in FIG. 13, in which a matrix array is horizontally multiplexed in conjunction with an electronic vertical scan. The electronic circuits may be devised using charge coupled devices and MOS field effect transistors thereby integrating the matrix detector and the electronic scanning circuits all in a single semiconductor wafer. The interface circuitry and high frequency multiplexer may be operated as follows. A bias is placed on only one horizontal bar so that horizontal row detectors can be horizontally multiplexed and scanned across the infrared image. The bottom bars are switched off and on sequentially so that one horizontal row of the detectors after another is connected into the circuit. It should be noted that the switching circuitry for the bottom silicon connections must be placed in the bottom of the silicon wafer. Thus, active devices are fabricated on both sides of the wafer. This can be easily done photolithographically on both sides of the slices. Simultaneous diffusions on both sides of the slice and metallization steps for top and bottom are provided.

FIG. 13 has been included to demonstrate a matrix array embodiment which would give an electrical output which would be completely TV compatible and could be connected directly to a TV display without any further electronic processing. This has been accomplished using the combination of switches and multiplexers. The switches for the initiation of the horizontal sweep on the TV display monitor, and this advance must increase during the horizontal scan (a ramp function); the net result is that the triangular areas 30 on the left and right hand sides of the matrix array in FIG. 13 do not appear on the TV screen. This additional complication in switching is necessary so that the shape of images sensed by the matrix array is not distorted because of the 70.53° angle between horizontal and vertical lines formed by the orientation dependent etching of the top and bottom slots. The TV monitor screen will have dark vertical bands at the left and right hand sides of the screen; these dark bands are caused by the increase in horizontal blanking time required by the need for a time segment in which to perform a ramp advance of the matrix horizontal scan.

The matrix array shown in FIG. 13 may also be used in a different electronic processing scheme. Rather than a vertical electronic scan provided by the switches on the left hand side of FIG. 13, the infrared image can be mechanically scanned across the array in a direction parallel to the "vertical" lines provided by the n-lines shown in FIG. 13. The multiplexing would be performed only after the clocked switcher had run through one complete cycle at a rate such that an image point on the infrared image is always on an active row of detectors. This is a delay-and-add scheme that will provide for more uniform detector response in that each video output signal is formed by the delay-and-add average of many (m-detector) detectors. One disadvantage in this scheme is that a very rapid mechanical scan must be utilized.

In another embodiment, a linear array or a combination of several linear arrays may be multiplexed to form a horizontal sweep while a mechanical scan is used to provide the vertical scan provided by the clocked switches in FIG. 13. This embodiment has the advantage that the rectangular detectors of FIGS. 1, 2, 3 and 4 may be utilized.

Electrical cross-talk (in a matrix array of $n \times n$ detectors) due to circuitous paths through $2n+l$ detectors is usually a critical defect of a matrix array concept. This problem can be eliminated or minimized by the bias arrangement. All the vertical bars of the detectors are connected at all times to the interface circuitry and, for example, +6 volt bias applied to the top contact of each detector. The high frequency multiplexer samples the output of every interface circuit for each detector without changing the +6 volt bias on the detector. Since the top contacts for the detectors are all at the same voltage (e.g. 6 volts) and the inactive horizontal contacts are also at this same voltage (e.g. 6 volts), the undesirable circuitous electrical leakage is eliminated. Those horizontal lines that are to be inactivated will be placed at +6 volts at the bottom contact (0 volts across the detector) using the clock switches shown on the left of FIG. 13. Only the horizontal row of the detectors that is to be activated will have its bottom contact at −6 volts (12 volts across the detector).

Figure 14:
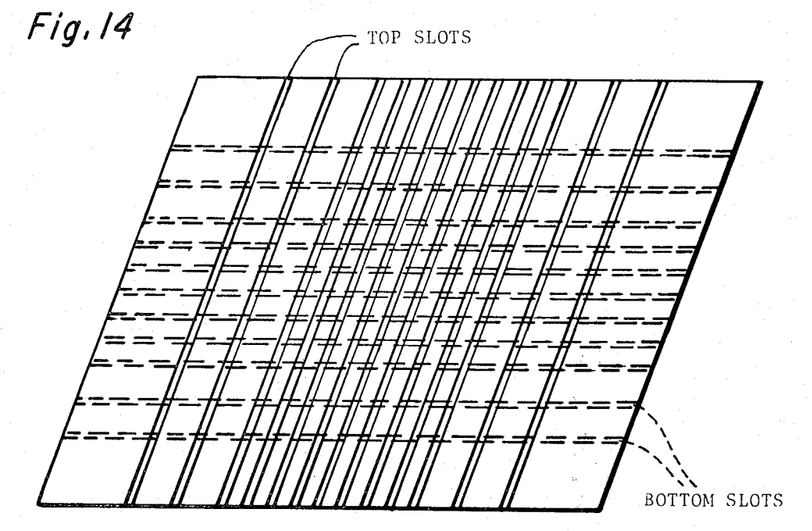
FIG. 14 illustrates a matrix array utilizing small area detectors in the center of the array and large area detectors on the periphery.

It should be noted that the slots do not have to be evenly spaced for either the linear array or the matrix array embodiments. For instance, in the case of matrix arrays, the slots may be of variable spacing so that the center of the array consists of small area detectors while the periphery consists of large area detectors. FIG. 14 shows a top view of this embodiment for a matrix array formed by slots narrow with respect to the space between the slots. This matrix array has an optical resolution variability similar to that of the human eye in that the center of the array has a high resolution "fovea" consisting of small area detectors while the periphery has low resolution provided by large area detectors. An actual array would have many more detectors than shown in FIG. 14.

Figure 15:
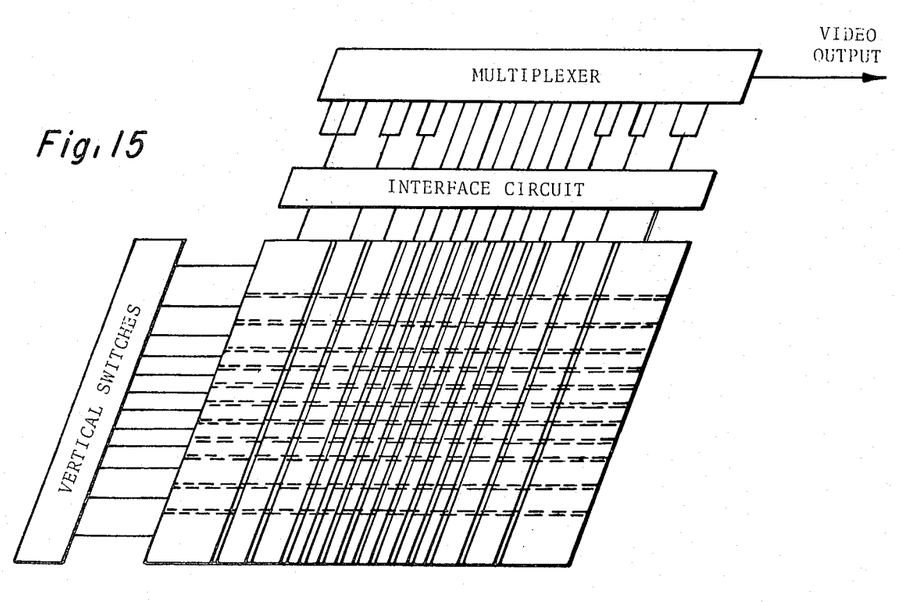
FIG. 15 illustrates a circuit used to scan the array of FIG. 14.

FIG. 15 shows how the variable resolution matrix array could be electronically scanned. In this figure, the matrix structure has been simplified so that the central array is surrounded by a single band of large area detectors. The dwell time of the vertical switches will have to be modified from that for the constant resolution matrix array: the large area detectors at top and bottom will have to be left on for a longer duration than that for the central rows of small detectors (so that the vertical scan proceeds at a constant linear rate for the detectors in a vertical column). Likewise, the output of the interface circuitry has to be divided for the large detectors so that these drive more than one input to the multiplexer (thus the horizontal scan provided by multiplexing proceeds along the detectors in a horizontal row at a constant linear rate). Alternatively, the electronic processing might be divided into several sections for the different areas of the array and later recombined in an external electronic processor such that various areas of the variable area array could be selected electronically for scanning. For instance the complete array could be scanned electronically and displayed on a TV monitor or only the central fovea scanned and displayed to yield a higher resolution display on the TV monitor. This embodiment has the advantage that the portion of the display can be chosen electronically.

In practice, using present day techniques, an actual matrix array would include many thousands of detectors; however, for simplicity, only a small number of detectors has been used for purposes of illustration in this application.

In another embodiment, a number of linear arrays as shown in FIG. 1 may be fabricated in a single wafer of silicon with solid silicon (free of etched slots) separating each linear array. The spacing between linear arrays is adjusted so that each spacing between arrays is sufficient to place interface circuitry and a multiplexer for each array. That is, if N linear arrays are placed on a wafer, then N interface plus CCD circuits will be placed on the wafer. In other words this embodiment differs from those shown in FIGS. 7–15 in that in this additional embodiment the linear arrays are spaced apart with circuitry for each [horizontal] row of detectors. In this additional embodiment, each of N rows is multiplexed and then the N outputs are combined electronically; this embodiment could be used in a delay-and-add electronic readout or a multiplexed TV compatible electronic readout.

Whereas the present invention has been described with respect to specific embodiments thereof, it will be understood that various changes and modificatios will be suggested to one skilled in the art and it is intended to encompass such changes and modifications as will fall in the scope of the appended claims.

What is claimed is:

1. An array of detectors formed in a single semiconductor wafer, each detector separated from the other on at least two sides by slots extending into the semiconductor wafer, and the detectors varying in width from the end of the array towards the center of the array.

2. An array of image detectors formed in a single semiconductor wafer wherein slots are formed in the wafer to define the detectors, the slots having variable spacing so that the center of the array consists of small area detectors while the periphery consists of large area detectors.

3. A monolithic infrared detector array comprising:
a block of monocrystalline semiconductor material taken from the group consisting of silicon and germanium, said block of semiconductor material being doped with an infrared-sensitive conductivity-determining impurity and having a plurality of parallel slots formed in at least one major surface thereof,
a patterned first metal layer opaque to infrared radiation overlying said one major surface of said semiconductor block and including a plurality of interrupted metal strips extending over the semiconductor material of said semiconductor block between successive slots formed therein,
a plurality of semiconductor regions of said one major surface of said semiconductor block including exposed areas arranged in at least one linear row across said plurality of metal strips and forming the interruptions therein,
the exposed areas of said plurality of semiconductor regions communicating with respective portions of said semiconductor block disposed therebeneath and defining active infrared detector areas,
said plurality of semiconductor regions respectively including portions thereof contacting the metal strip segments on opposite sides of the exposed areas of said plurality of semiconductor regions,
insulation means interposed between the remaining portions of said patterned first metal layer and said one major surface of said semiconductor block, and
a second metal layer on the other major surface of said semiconductor block in contact with each of the detector areas defined therein.

4. A monolithic infrared detector array as set forth in claim 3, wherein said plurality of semiconductor regions are of lower resistivity relative to the semiconductor material of at least the major portion of said semiconductor block.

5. A monolithic infrared detector array as set forth in claim 4, wherein said block of semiconductor material is of silicon doped with an infrared-sensitive conductivity-determining impurity, and said plurality of semiconductor regions of said one major surface of said semiconductor block being of boron-doped silicon.

6. A monolithic infrared detector array as set forth in claim 3, further including electronic circuit means formed in the same semiconductor block as said plurality of infrared detector areas and being operable to provide scanning of the array of said detector areas for producing an output signal.

7. A monolithic infrared detector array as set forth in claim 6, wherein said electronic circuit means includes switching and multiplexing circuits formed in the same semiconductor block as said plurality of infrared detector areas to scan the detector array and to provide an output signal.

8. A monolithic infrared detector array as set forth in claim 3, wherein said plurality of semiconductor regions of said one major surface of said semiconductor block includes exposed areas arranged in a plurality of linear rows across said plurality of metal strips and forming plural interruptions therein.

9. A monolithic infrared detector array as set forth in claim 3, wherein said plurality of paallel slots formed in at least one major surface of said block of semiconductor material are defined by respective pairs of spaced opposed side walls of semiconductor material lying within parallel crystallographic planes taken from the group consisting of one of the {111}, {221}, {331} and {112} families of crystallographic planes.

10. A monolithic infrared detector array as set forth in claim 3, wherein said semiconductor block is further provided with a plurality of parallel slots formed in the other major surfaces thereof and orthogonally related to the plurality of parallel slots formed in said one major suface thereof, and said second metal layer being a patterned metal layer including a plurality of metal strips extending over the semiconductor material of said semiconductor block between successive slots formed therein.

11. A monolithic infrared detector array as set forth in claim 10, wherein both pluralities of parallel slots respectively formed in said one major surface and said other major surface of said semiconductor block extend at least half way through said semiconductor block and said plurality of parallel slots formed in said other major surface of said semiconductor block intersecting with said plurality of parallel slots formed in said one major surface of said semiconductor block to define first and second sets of parallel semiconductor bars orthogonally related to each other.

12. A monolithic infrared detector array as set forth in claim 11, wherein each of said pluralities of parallel slots respectively formed in said one major surface and said other major surface of said semiconductor block are defined by respective pairs of spaced opposed side walls of semiconductor material lying within parallel crystallographic planes within the {111} family of crystallographic planes, and said plurality of parallel slots formed in said other majore surface of said semiconductor block intersecting with said plurality of parallel slots formed in said one major surface of said semiconductor block at an anle of 70.53° in the (110) plane.

13. A method of fabricating a monolithic infrared detector array comprising:
doping a block of monocrystalline semiconductor material taken from the group consisting of silicon and germanium with an infrared-sensitive conductivity-determining impurity,
subjecting the semiconductor block to an orientation dependent etchant treatment to provide a plurality of parallel slots in at least one major surface of said semiconductor block defined by respective pairs of spaced opposed side walls of semiconductor material lying within parallel crystallographic planes taken from the group consisting of one of the {111}, {221}, {331} and {112} families of crystallographic planes,
depositing a layer of insulation material on said one major surface of said semiconductor block,
patterning said layer of insulation material to provide a plurality of exposed semiconductor regions of said one major surface of said semiconductor block arranged in at least one linear row and respectivelyy separated by said parallel slots,
depositing a first metal layer opaque to infrared radiation on said patterned layer of insulation material and overlying said one major surface of said semiconductor block,
patterning said first metal layer to provide a plurality of interrupted metal strips extending over said semiconductor block between successive slots formed therein and so as to include metal strip segments contacting the opposite sides of each of the exposed semiconductor regions of said one major surface of said semiconductor block, and depositing a second metal layer on the other major surface of said semiconductor block.

14. A method as set forth in claim 13, further including doping the plurality of exposed semiconductor regions of said one major surface of said semiconductor block with an impurity lowering the resistivity of said plurality of semiconductor regions relative to the semiconductor material of at least the major portion of said semiconductor block.

15. A method as set forth in claim 14, wherein the doping of said plurality of exposed semiconductor regions for imparting lower resistivity thereto is accomplished by ion implantation.

16. A method as set forth in claim 13, wherein the orientation dependent etchant treatment to which said semiconductor block is subjected further provides a plurality of parallel slots in the other major surface of said semiconductor block and orthogonally related to the plurality of parallel slots in said one major surface thereof, and patterning said second metal layer to provide a plurality of metal strips extending over the semiconductor material of the other major surface of said semiconductor block between successive slots formed therein.

17. A method as set forth in claim 16, wherein the orientation dependent etchant treatment to which said semiconductor block is subjected forms each of said pluralities of parallel slots respectively provided in said one major surface and said other major surface of said semiconductor block by respective pairs of spaced opposed side walls of semiconductor material lying within parallel crystallographic planes within the {111} family of crystallographic planes such that said plurality of parallel slots in said other major surface of said semiconductor block intersect with said plurality of parallel slots in said one major surface of said semiconductor block at an angle of 70.53° in the (110) plane.

* * * * *